(12) United States Patent
Hashimoto et al.

(10) Patent No.: US 8,420,041 B2
(45) Date of Patent: Apr. 16, 2013

(54) HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL

(75) Inventors: Tadao Hashimoto, Santa Barbara, CA (US); Edward Letts, Buellton, CA (US); Masanori Ikari, Santa Barbara, CA (US)

(73) Assignee: Sixpoint Materials, Inc., Buellton, CA (US)

( * ) Notice: Subject to any disclaimer, the term of this patent is extended or adjusted under 35 U.S.C. 154(b) by 0 days.

(21) Appl. No.: 13/491,392

(22) Filed: Jun. 7, 2012

(65) Prior Publication Data

US 2012/0304917 A1    Dec. 6, 2012

Related U.S. Application Data

(62) Division of application No. 12/455,683, filed on Jun. 4, 2009, now Pat. No. 8,236,267.

(60) Provisional application No. 61/058,910, filed on Jun. 4, 2008.

(51) Int. Cl.
| | |
|---|---|
| *C01B 21/06* | (2006.01) |
| *C30B 23/00* | (2006.01) |
| *C23C 16/00* | (2006.01) |

(52) U.S. Cl.
USPC ............. 423/409; 117/88; 117/95; 117/97; 118/715; 118/725

(58) Field of Classification Search ................. None
See application file for complete search history.

*Primary Examiner* — Milton I Cano
*Assistant Examiner* — Sarah A Slifka
(74) *Attorney, Agent, or Firm* — K&L Gates LLP (57) ABSTRACT

The present invention discloses a high-pressure vessel of large size formed with a limited size of e.g. Ni—Cr based precipitation hardenable superalloy. Vessel may have multiple zones. For instance, the high-pressure vessel may be divided into at least three regions with flow-restricting devices and the crystallization region is set higher temperature than other regions. This structure helps to reliably seal both ends of the high-pressure vessel, at the same time, may help to greatly reduce unfavorable precipitation of group III nitride at the bottom of the vessel. Invention also discloses novel procedures to grow crystals with improved purity, transparency and structural quality. Alkali metal-containing mineralizers are charged with minimum exposure to oxygen and moisture until the high-pressure vessel is filled with ammonia. Several methods to reduce oxygen contamination during the process steps are presented. Back etching of seed crystals and a new temperature ramping scheme to improve structural quality are disclosed.

24 Claims, 3 Drawing Sheets
(2 of 3 Drawing Sheet(s) Filed in Color)

HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL

CROSS REFERENCE TO RELATED APPLICATIONS

This application is a divisional application of and claims priority to U.S. application Ser. No. 12/455,683, filed Jun. 4, 2009 now U.S. Pat. No. 8,236,267 entitled "High-Pressure Vessel For Growing Group III Nitride Crystals And Method Of Growing Group III Nitride Crystals Using High-Pressure Vessel And Group III Nitride Crystal," which claims priority to U.S. App. Ser. No. 61/058,910 entitled "High-Pressure Vessel For Growing Group III Nitride Crystals And Method Of Growing Group III Nitride Crystals Using High-Pressure Vessel And Group III Nitride Crystal", inventors Tadao Hashimoto, Edward Letts, and Masanori Ikari, filed on Jun. 4, 2008, the entire contents of each of which are incorporated by reference herein as if put forth in full below. This application is also related to PCT application serial number PCT/US2009/046317 entitled "High-Pressure Vessel For Growing Group III Nitride Crystals And Method Of Growing Group III Nitride Crystals Using High-Pressure Vessel And Group III Nitride Crystal", inventors Tadao Hashimoto, Edward Letts, and Masanori Ikari, filed on Jun. 4, 2009, the entire contents of which are incorporated by reference herein as if put forth in full below.

This application is also related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,"

U.S. Utility Patent Application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,".

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,".

all of which applications are incorporated by reference herein.

FIELD OF THE INVENTION

The invention is related to the high-pressure vessel used to grow group III nitride crystals expressed as $B_xAl_yGa_zIn_{1-x-y-z}N (0 \leq x,y,z \leq 1)$ such as gallium nitride, boron nitride, indium nitride, aluminum nitride, and their solid solutions in high-pressure ammonia. The invention is also related to the method of growing group III nitride crystals and the grown group III nitride crystals.

BACKGROUND (Note: This patent application refers to several publications and patents as indicated with numbers within brackets, e.g., [x]. A list of these publications and patents can be found in the section entitled "References.")

Gallium nitride (GaN) and its related group-III alloys are key materials for various opto-electronic and electronic devices such as light emitting diodes (LEDs), laser diodes (LDs), microwave power transistors, and solar-blind photo detectors. Currently LEDs are widely used in cell phones, indicators, displays, and LDs are used in data storage disk drives. However, the majority of these devices are grown epitaxially on heterogeneous substrates, such as sapphire and silicon carbide since GaN wafers are extremely expensive compared to these heteroepitaxial substrates. The heteroepitaxial growth of group III-nitride causes highly defected or even cracked films, which hinders the realization of high-end optical and electronic devices, such as high-brightness LEDs for general lighting or high-power microwave transistors.

To solve fundamental problems caused by heteroepitaxy, it is useful to utilize single crystalline group III nitride wafers sliced from bulk group III nitride crystal ingots. For the majority of devices, single crystalline GaN wafers are favorable because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots. Growth methods using molten Ga, such as high-pressure high-temperature synthesis [1,2] and sodium flux [3,4], have been proposed to grow GaN crystals, nevertheless the crystal shape grown in molten Ga becomes a thin platelet because molten Ga has low solubility of nitrogen and a low diffusion coefficient of nitrogen.

The ammonothermal method, which is a solvothermal method using high-pressure ammonia as a solvent has demonstrated successful growth of real bulk GaN [5-10]. This new technique is able to grow large GaN crystal ingots, because high-pressure ammonia used as a fluid medium has a high solubility of source materials such as GaN polycrystals or metallic Ga, and high transport speed of dissolved precursors can be achieved. There are mainly three approaches to grow GaN in supercritical ammonia; a method using ammonobasic solutions in single reactor with external heating as disclosed in [6-10] and a method using ammonoacidic solutions in Pt-lined single reactor with external heating as disclosed in [11] and a method using supercritical ammonia with a capsule and internal heaters enclosed in high-pressure reactor as disclosed in [12]. The latter two methods have disadvantages in expanding the reactor scale. For the ammonoacidic approach, it is extremely expensive to use a Pt-liner in a large-scaled pressure vessel. As for the internal capsule, it is structurally very challenging to operate the capsule reactor larger than 2" diameter. Therefore, the ammonothermal growth using basic mineralizer is the most practical approach to mass-produce bulk GaN. As disclosed in the literature [6, 13-16], GaN has retrograde solubility in supercritical ammonobasic solutions. Therefore, in the conventional ammonothermal growth using basic mineralizer, the temperature for a nutrient zone is set lower than that for a crystallization zone. In addition to this temperature setting, basic ammonothermal method differs in many aspects from other solvothermal methods such as hydrothermal growth of quartz and zinc oxide. Because of this difference, it is not straightforward to apply the solvothermal method to grow group III nitride crystals and more improvements are required to realize mass production of GaN wafers by the ammonothermal method.

First, state-of-the-art ammonothermal method [6-10] lacks scalability into industrial production because it is quite difficult to obtain large enough superalloy material to construct a high-pressure vessel. Since group III nitrides have high melting temperature or dissociation temperature, crystal growth requires relatively higher temperature than other materials grown by the solvothermal method. For example, both quartz and zinc oxide (ZnO) are grown at about 300-400° C. by the hydrothermal method. On the other hand, typical growth temperature of GaN in the ammonothermal method is 450-600° C. [6-10]. Furthermore, our experiment showed that growth at 550° C. or above is typically needed to obtain high-quality crystals. Therefore, Ni—Cr based precipitation hardenable (or age hardenable) superalloy such as Rene-41 (Haynes R-41 or Pyromet 41), Inconel 720 (Pyromet 720), Inconel 718 (Pyromet 718), and Waspaloy A must be used for a vessel material. These superalloys are forged to obtain small-sized, dense grain structure which provides the necessary tensile strength for conditions allowing the solvent to be supercritical. However, if the solid dimension of the piece being worked (such as its thickness) becomes too large, the grain structure necessary for high-tensile strength cannot be obtained by forging. This is because the forging pressure is always applied from the surface during the forging process and the grain size at the inner portion of the material tends to be unaffected if the work size exceeds a certain size. Cracking during the forging/cooling process is also profound for large diameter rods. These problems limit the available size of Ni–Cr based precipitation hardenable superalloys. In case of Rene-41, the maximum available outer diameter for a rod is 12 inch, although the maximum outer diameter for an as-cast (i.e. unforged) rod is larger than 12 inch.

Another obstacle to apply the ammonothermal method to commercial production of GaN single crystals is mediocre quality of grown crystals. Currently, their purity, transparency and structural quality are not sufficient for commercial use. In particular, oxygen concentration is at the order of $10^{20}$ $cm^{-3}$. This high level of oxygen together with Ga vacancy is thought to be the origin of brownish color of GaN grown by the ammonothermal method. The grown crystals also show multiple grains in the growth plane.

Considering above-mentioned limitations, this patent discloses several new ideas to realize a high-pressure vessel that is practically usable for production of group III nitride crystals by the ammonothermal method. This patent also discloses new ways to improve purity, transparency, and structural quality of group III nitride crystals grown by the ammonothermal method.

SUMMARY OF THE INVENTION

The present invention discloses a new high-pressure vessel suitable for use in ammonothermal growth of a Group III-nitride material. The vessel is made from a raw material such as superalloy rod or billet limited in size today when incorporated into a high-pressure vessel. A multiple-zone high-pressure vessel, which can attain the largest possible high-pressure vessel is disclosed.

The vessel may have one or more clamps to seal the vessel. A clamp may be formed of a metal or alloy having grain flow in a radial direction in the clamp. This configuration enables the vessel to be much greater in size than vessels today.

The high-pressure vessel may be divided into at least three regions by flow-restricting devices such as baffles. In this embodiment, the vessel has a nutrient region in which a nutrient such as polycrystalline GaN or other feed material is dissolved or supplied. The vessel also has a crystallization region in which the group III-nitride material is crystallized upon a seed material. The vessel also has a buffer region between the nutrient region and the crystallization region, one or more cool zones adjacent to the crystallization zone and/or the nutrient zone and in the vicinity of a clamp, or both.

This invention also discloses new procedures to grow crystals with improved purity, transparency and structural quality. Alkali metal-containing mineralizers are charged with minimum exposure to oxygen and moisture until the high-pressure vessel is filled with ammonia. Several methods to reduce oxygen contamination during the process steps are presented. Also, back etching of seed crystals and a new temperature ramping scheme to improve structural quality are disclosed.

In addition, the current invention discloses a method of reducing parasitic deposition of polycrystalline GaN on the inner surface of the pressure vessel while optionally improving structural quality and without reducing growth rate. Because of the retrograde solubility of GaN in the ammonothermal growth using basic mineralizers, the temperature in the crystallization region is conventionally set higher than the temperature in the nutrient region. We, however, discovered that GaN can be grown by setting the temperature of the crystallization region slightly lower than the temperature of the nutrient region. By utilizing this "reverse" temperature setting for growth, parasitic deposition of GaN on the reactor wall was greatly reduced. Moreover, the structural quality of grown crystal was improved without sacrificing growth rate.

BRIEF DESCRIPTION OF THE DRAWINGS

The patent or application file contains at least one drawing executed in color. Copies of this patent or patent application publication with color drawing(s) will be provided by the Office upon request and payment of the necessary fee. Referring now to the drawings in which like reference numbers represent corresponding parts throughout.

In the figure each number represents the followings:
1. High-pressure vessel
2. Lid
3. Clamp
4. Gasket
5. Heater(s) for the crystallization region
6. Heater(s) for the dissolution region
7. Flow-restricting baffle(s)
8. Nutrient basket
9. Nutrient
10. Seed crystals
11. Flow-restricting baffle(s)
12. Blast containment enclosure
13. Valve
14. Exhaust tube 15. Device to operate valve

DETAILED DESCRIPTION OF THE INVENTION

Overview

The present invention provides a design to achieve a high-pressure vessel suitable for mass production of group III-nitride crystals by the ammonothermal method. With the limited size of available Ni—Cr based precipitation hardenable superalloy, innovative designs are presented to maximize the vessel size. Also, methods of growing improved-quality group III nitride crystals are presented.

In one instance, the invention provides a reactor for ammonothermal growth of a group III-nitride crystalline ingot. The reactor has: a body defining a chamber; and a first clamp for sealing an end of the reactor, wherein the first clamp is formed of a metal or alloy having a grain flow in a radial direction in the clamp.

In another instance, a reactor for ammonothermal growth of a group III-nitride crystalline ingot has: a body defining a chamber; a first heater for heating a nutrient region of the reactor; a second heater for heating a crystallization region of the reactor; a third region selected from a buffer region and an end region; and at least one baffle separating the crystallization region from the nutrient region or the crystallization region from an end region of the reactor, with the qualifications that the buffer region when present is defined by a plurality of baffles comprising a first end baffle and an opposite end baffle with one or more optional baffles therebetween, and a distance from the first end baffle to the opposite end baffle of the plurality is at least ⅕ of an inner diameter of the reactor; and the reactor further comprises a first clamp at the end region when the end region is present.

Any of the reactors described herein may have a single opening at an end. Alternatively, any of the reactors described herein may have two or more openings, with one opening at each end of the reactor body. The reactor may be generally cylindrical, or the reactor may be formed in another shape such as spherical or semispherical.

A reactor as discussed herein may have a buffer region and/or one or more cooled end regions.

A clamp for the reactor, such as a clamp positioned in an end region, may be formed of a metal or alloy having a grain flow in a radial direction in the clamp. The clamp may be formed of a superalloy such as a Ni—Cr superalloy. Alternatively, a clamp may be formed of high strength steel.

A reactor may have a first heater that is configured to maintain the nutrient region of the reactor at a temperature near but greater than a temperature of the reactor in a crystallization region of the reactor when the reactor is configured to grow a gallium nitride crystal having retrograde solubility in supercritical ammonia.

The reactor may be configured so that the first heater maintains the nutrient region no more than about 20° C. greater than the temperature of the crystallization region.

Any reactor may have a second clamp for sealing a second end of the reactor. The second clamp may be identical to the first clamp discussed above.

The clamp may be formed in two or three or more pieces so that the clamp can be disassembled and removed from the reactor. The pieces may be held together by bolts formed of the same material as the clamps.

A reactor for ammonothermal growth of a group III-nitride crystalline ingot may also have a body defining a chamber; and a mineralizer in an encapsulant, wherein the encapsulant is an oxygen-and water-impermeable material capable of rupturing under growth conditions in the reactor.

As discussed in further detail below, the encapsulant may be a metal or alloy coating on the mineralizer that softens or melts at crystal growth conditions in the reactor.

The encapsulant may instead or additionally comprise a water- and oxygen-impermeable container that ruptures under crystal growth conditions in the reactor.

The container may have a chamber which contains the encapsulant and has a pressure much less than a pressure within the reactor under crystal growth conditions, so that the pressure on the container exceeds its yield strength when the reactor attains operating pressure and temperature.

Any of the reactors disclosed herein may operate using an ammonobasic supercritical solution or an ammonoacidic supercritical solution. The mineralizer may therefore be basic or acidic. Such mineralizers are well-known in the art.

Also disclosed herein is a method of forming a group III-nitride crystalline material. The method includes:

providing a mineralizer substantially free of oxygen and water to a reaction chamber of an ammonothermal growth reactor evacuating the chamber growing the group III-nitride crystalline material in the chamber.

Any method disclosed herein may include providing an oxygen getter in the reaction chamber.

A method of forming gallium nitride crystalline material may comprise heating a nutrient comprising polycrystalline GaN in a nutrient region of a reactor heating a seed material in a crystallization region of the reactor dissolving the polycrystalline GaN in supercritical ammonia depositing the dissolved GaN on the seed material to grow the gallium nitride crystalline material wherein the temperature of the nutrient region is greater than but near the temperature of the crystallization region.

In such a method, the difference in temperature between the nutrient region and the crystallization region may be no more than about 50, 40, 30, 25, 20, 15, or 10° C. during the act of depositing the dissolved GaN on the seed material.

Any method discussed herein may further comprise back-etching the nutrient prior to the act of growing the crystalline material.

Reactors and methods are discussed in greater detail below.

Technical Description

Since there is a size limitation in forged materials, it is not possible today to obtain large diameter rod of various metals or alloys such as precipitation hardenable Ni—Cr based superalloy from which a pressure vessel suitable for ammonothermal growth of a group III-nitride crystalline material can be made. For example, the maximum diameter of as-cast R-41 billet is 17 inches, and this billet is forged (e.g. round-forged, where the forging pressure is applied along the radial direction) into 12-inch diameter rod before making the reactor. This is the maximum diameter of forged rod in state-of-the-art technology and means that the maximum outer diameter of the high-pressure vessel can be close to 12 inches. However, this maximum diameter cannot be realized using existing methods because it is also necessary to form clamps for the high-pressure vessel from the forged metal or alloy.

For a high-pressure vessel of this scale, a clamp-type closure is safer and more practical due to the increased cover load (i.e. the force applied to lids at the conditions present in ammonothermal crystal growth). A screw-type closure is not practical for a high-pressure vessel having an inner diameter larger than 2 inches because the screw cap requires too many threads to hold the cover load.

However, since the clamp diameter must be larger than the outer diameter of the high-pressure vessel, the maximum outer diameter of the high-pressure vessel is limited by the clamp diameter. Using R-41 for example, the clamp diameter of 12 inch results in a high-pressure vessel with 4-6 inch outer diameter and 2-3 inch inner diameter. Although one can produce 2-inch wafers of GaN with such high-pressure vessel, the productivity is not large enough to compete with other growth methods such as hydride vapor phase epitaxy (HVPE).

EXAMPLE 1

To solve the above-mentioned problem, a few methods to obtain larger clamps were sought and we discovered it possible to manufacture a large diameter disk with e.g. precipitation hardenable Ni—Cr based superalloy or other metal or alloy by forging as-cast billet along longitudinal direction. With this method, a 17-inch as-cast billet is forged along the longitudinal direction to form a 20-inch diameter, 1-foot thick disk. The forging process usually creates a directional microstructure (grain flow) which determines tensile strength of the material.

The grain flow of the round rod to construct the body and lids is typically along the longitudinal direction whereas the grain flow of the disks to construct the clamps is along the radial direction. While one might expect a disk with radial grain flow rather than axial grain flow to not have sufficient tensile strength to reliably clamp a lid to a reactor body during use, this difference does not have a significant impact on the reliability of the high-pressure vessel as long as the high-pressure vessel is designed with sufficient safety factor. With this method, we designed a high-pressure vessel with 11.5" outer diameter, 4.75" inner diameter, and height larger than 47.5". Since the height of the high-pressure vessel is large, it is necessary to bore a hole from both ends to form a chamber within the reactor vessel. Therefore a high-pressure vessel might require two lids, one on each end. The clamp diameter in this instance is 20" and the thickness is 12", which ensures sufficient strength to hold a lid during crystal growth. A large clamp such as this may be formed of two or more clamp sections that are e.g. bolted together to form the finished clamp.

Figure 1:
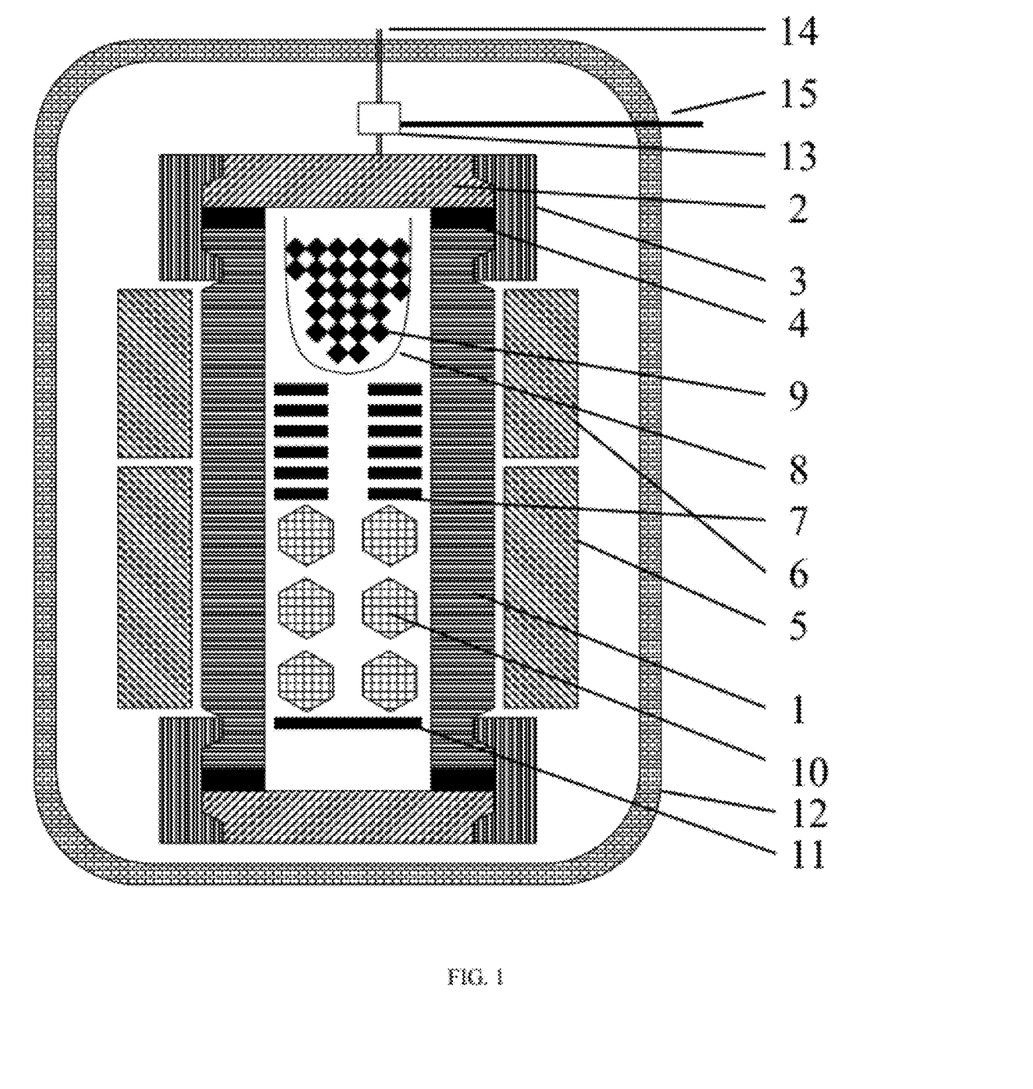
FIG. 1 is a schematic drawing of the high-pressure vessel in this invention.

A large reactor such as the one discussed above provides greater opportunities to improve the quality of larger-diameter crystal grown in the reactor. Hot ammonia circulates inside the high-pressure vessel and transfers heat. To establish preferable temperature distribution, flow-restricting baffles may be used. Unlike the conventional ammonothermal reactor, the invented high-pressure vessel may be equipped with a flow restricting baffle to cool the bottom region (11 in FIG. 1). In this way, the temperature around the seal and the clamp is maintained lower than that of the crystallization region to improve reliability. In addition, this temperature distribution prevents unnecessary precipitation of GaN on the bottom lid.

The large reactor design also allows a large buffer region to be incorporated between the crystallization region and the nutrient region. This buffer region may comprise multiple baffles where holes or openings in a baffle are offset from holes or openings in adjacent baffles.

These baffles increase the average residence time within the buffer region while providing some regions of relatively stagnant flow and other regions of vortex flow for ammonia passing through the regions between baffles. The average flow-rate from the nutrient region to the crystallization region in the larger-diameter reactor may also be less than the average flow-rate from the nutrient region to the crystallization region in a smaller-diameter reactor.

The buffer region may also be positioned primarily or exclusively adjacent to the heaters for the nutrient region for a reactor configured to provide a lower temperature in the nutrient region and higher temperature in the crystallization region to take advantage of the retrograde solubility of e.g. GaN in supercritical ammonia. Or, the buffer region may extend past heaters for the crystallization zone to provide earlier heating or cooling of the supercritical ammonia, so that the ammonia solution is more likely to be at the desired temperature when the solution encounters the seed material.

The slower ammonia flow supplied in the crystallization region with its increased residence time in the buffer zone, of the supersaturated ammonia, may thus increase the growth rate as shown in Example 3.

As the size of the high-pressure vessel increases, the total internal volume becomes large. Thus, it is important to mitigate possible blast hazards. The equivalent blast energy in this example is estimated to be as high as 9 lbs TNT. In this example, we designed a blast containment enclosure having ½ inch-thick steel wall (12 in FIG. 1). One important thing is that the ammonia in the high-pressure vessel can be released by remote operation of the high-pressure valve (13 in FIG. 1). The valve can be remote-operated via either mechanical, electrical, or pneumatic way.

EXAMPLE 2

Another method to realize a large diameter high-pressure vessel is to use high-strength steel for the clamp material. Although the maximum practical temperature for high-strength steel (such as 4140) is 550° C., the maximum available size is large enough to fabricate clamps for high-pressure vessel having 12-inch outer diameter. In this case extra caution is necessary to control the clamp temperature. An end region in the reactor that has one or more baffles to impede ammonia flow permits ammonia to cool in an end region, reducing the reactor temperature in that region and allowing a clamp to be formed of a material such as high strength steel that might not otherwise be used to form a clamp. Also, appropriate anti-corrosion coating is advisable in case of ammonia leak since steel is susceptible to corrosion by basic ammonia.

EXAMPLE 3

In this example, a high-pressure vessel having an inner diameter of 1 inch was used to demonstrate the enhanced growth rate by having one or more buffer regions between the crystallization region and the nutrient region. Unlike the Examples 1, 2, this high-pressure vessel has an open end on one side only. The chamber of the high-pressure vessel is divided into several regions. From bottom to top, there were a crystallization region, buffer regions, and a nutrient region. GaN crystals were grown with 2 buffer regions, 5 buffer regions, and 8 buffer regions and the growth rate in each condition was compared. First, the high-pressure vessel was loaded with 4 g of $NaNH_2$, a seed crystal suspended from a flow-restricting baffle having 55 mm-long legs (the first baffle). To create buffer regions, 2 flow restricting baffles with 18 mm legs, 5 flow restricting baffles with 18 mm legs or 8 flow restricting baffles with 10 mm legs were set on top of the first baffle (i.e. buffer regions with height of 18 mm were created for the first two conditions and buffer regions with height of 10 mm were created for the last condition). All of the baffles had ¼" hole at the center and the total opening was about 14%. The baffle holes in this instance were not offset from one another. On top of these baffles, a Ni basket containing 10 g of polycrystalline GaN was placed and the high-pressure vessel was sealed with a lid. All of these loading steps were carried out in a glove box filled with nitrogen. The oxygen and moisture concentration in the glove box was maintained to be less than 1 ppm. Then, the high-pressure vessel was connected to a gas/vacuum system, which can pump down the vessel as well as supply $NH_3$ to the vessel. First, the high-pressure vessel was pumped down with a turbo molecular pump to achieve pressure less than $1 \times 10^{-5}$ mbar. The actual pressure in this example was $2.0 \times 10^{-6}$, $2.4 \times 10^{-6}$ and $1.4 \times 10^{-6}$ mbar for conditions with 2, 5, and 8 buffer regions, respectively. In this way, residual oxygen and moisture on the inner wall of the high-pressure vessel were removed. After this, the high-pressure vessel was chilled with liquid nitrogen and $NH_3$ was condensed in the high-pressure vessel. About 40 g of $NH_3$ was charged in the high-pressure vessel. After closing the high-pressure valve of the high-pressure vessel, the vessel was transferred to a two zone furnace. The high-pressure vessel was heated to 575° C. of the crystallization zone and 510° C. for the nutrient zone. After 7 days, ammonia was released and the high-pressure vessel was opened. The growth rate for conditions with 2, 5, and 8 buffer regions were 65, 131, and 153 microns per day, respectively.

The growth rate was increased with increased number of buffer regions between the crystallization region and the nutrient region. One reason for the enhanced growth rate is that the convective flow of ammonia became slower as the buffer regions increased. Another reason is creating larger temperature difference by restricting heat exchange between the nutrient region and crystallization region. Therefore, adjusting the opening of the baffle, changing the position of holes on the baffle, adjusting the height of the buffer region is expected to have a similar effect on growth rate. To enhance the growth rate effectively, it is desirable to maintain the height of the buffer region larger than ⅕ of the inner diameter of the high-pressure vessel so that enough space is created to promote stagnant/vortex flow of ammonia.

Technical Description

Here several methods to improve purity, transparency, and structural quality of GaN grown by the ammonothermal method are presented. The followings examples help illustrate further principles of the claimed invention, as do the preceding examples.

EXAMPLE 4

Figure 2:
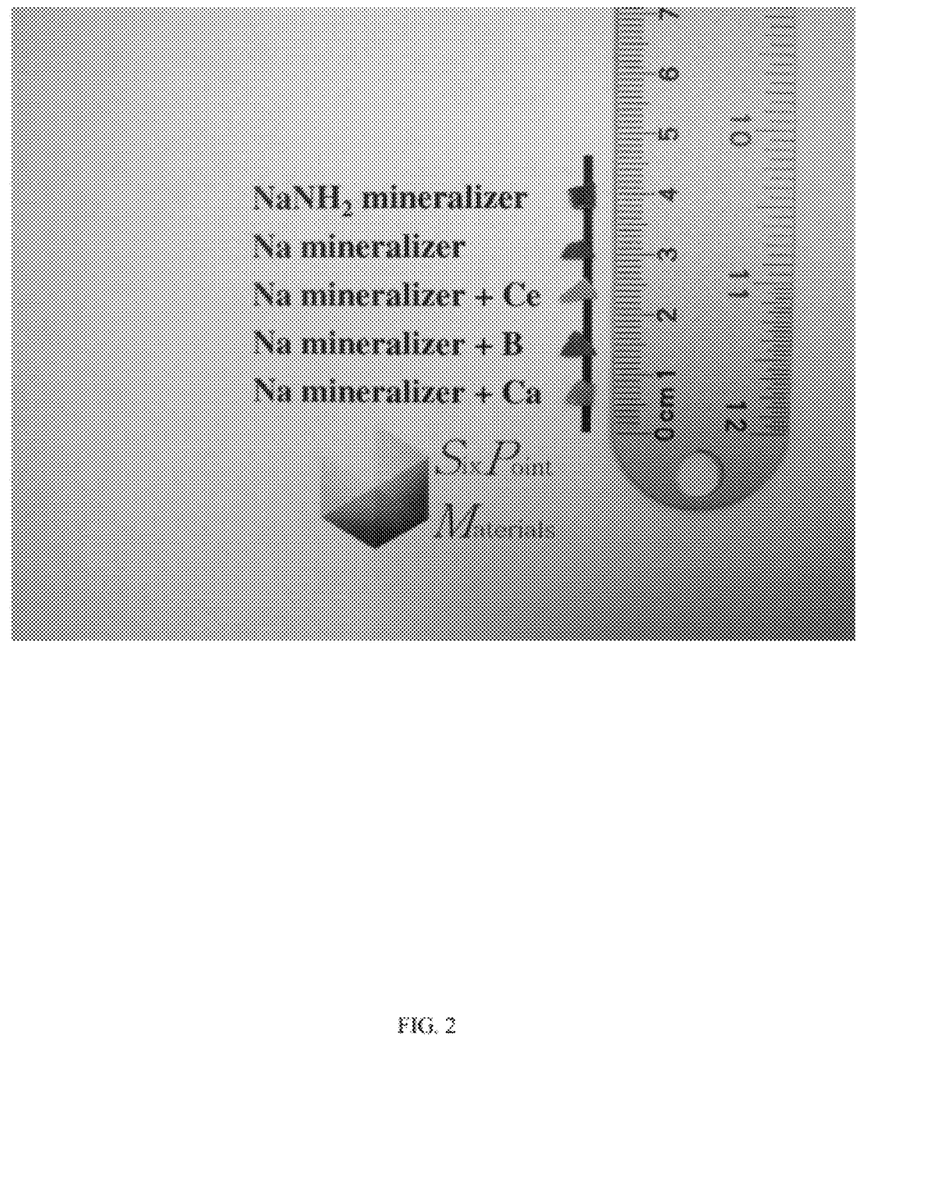
FIG. 2 is a photograph comparing colorations depending on mineralizers and additives.

In this example, a high-pressure vessel having an inner diameter of 1 inch was used to demonstrate the ammonothermal growth steps with high-vacuum pumping before ammonia filling. Unlike the Examples 1, 2, this high-pressure vessel has an open end on one side only. All necessary sources and internal components including 10 g of polycrystalline GaN nutrient held in a Ni basket, 0.3 mm-thick single crystalline GaN seeds, and three flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 4 g of $NaNH_2$ was used as a mineralizer. After loading the mineralizer into the high-pressure vessel, three baffles together with seeds and nutrient were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was heated at 110° C. and evacuated with a turbo molecular pump to achieve pressure less than $1 \times 10^{-5}$ mbar. The actual pressure before filling ammonia was $2.0 \times 10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. The crystallization region was maintained at 575° C. and the nutrient region was maintained at 510° C. After 7 days, ammonia was released and the high-pressure vessel was opened. The grown crystals showed dark brownish color (the top sample in FIG. 2) and the oxygen concentration measured with secondary ion mass spectroscopy (SIMS) was $1.2\text{-}2.8 \times 10^{20}$ $cm^{-3}$. In this example, pumping and heating of the high-pressure vessel did not contribute to oxygen reduction. This is because the $NaNH_2$ mineralizer contained significant amount of oxygen/moisture as shown in the next example. After minimizing oxygen/moisture content of mineralizers, pumping and heating of the high-pressure vessel is necessary to minimize possible source of oxygen in the process.

EXAMPLE 5

In this example, a high-pressure vessel having an inner diameter of 1 inch was used to demonstrate the ammonothermal growth steps using Na mineralizer with high-vacuum pumping before ammonia filling. Unlike the Examples 1, 2, this high-pressure vessel has an open end on one side. All necessary sources and internal components including 10 g of polycrystalline GaN nutrient held in a Ni basket, 0.3 mm-thick single crystalline GaN seeds, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.3 g of Na cube was used as a mineralizer. The surface of the Na was "peeled" to remove oxide layer. However, even in the glovebox, the fresh surface changed color in seconds, which represented instantaneous oxidation of the Na surface. After loading the mineralizer into the high-pressure vessel, six baffles together with seeds and nutrient were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was evacuated at room temperature with a turbo molecular pump to achieve pressure less than $1 \times 10^{-5}$ mbar. The actual pressure before filling ammonia was $1.5 \times 10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. The crystallization region was maintained at 575° C. and the nutrient region was maintained at 510° C. After 7 days, ammonia was released and the high-pressure vessel was opened. The coloration of the grown crystals was improved (the second sample from the top in FIG. 2). The oxygen concentration measured by secondary ion mass spectroscopy (SIMS) was $0.7\text{-}2.0\times10^{19}$ cm$^{-3}$, which was more than one order of magnitude lower level than the sample in Example 4. Using mineralizer with low oxygen/moisture content together with pumping the high-pressure vessel is shown to be important to minimize oxygen concentration in the crystal.

EXAMPLE 6

As shown in Example 5, reducing oxygen/moisture content of mineralizers is vital for improving purity of GaN. As explained in Example 5, Na surface was oxidized quickly even in the glove box. Therefore, it is important to reduce exposed surface of Na or alkali metal mineralizers. Oxidation of Na was reduced by melting the Na in Ni crucible. A hot plate was introduced in the glovebox mentioned in the Example 5 to heat Ni crucible under oxygen and moisture controlled environment. After removing surface oxide layer of Na, it was placed in a Ni crucible heated on the hot plate. When the Na melts, its surface fully contacts on the bottom and wall of the crucible. Ni foil is placed on the top surface of the Na to minimize exposed surface of Na. Since the Ni crucible is small enough to fit the autoclave and Ni is stable in the growth environment, the Ni crucible containing Na can be loaded in the high-pressure vessel directly. In this way, most of surface of Na is covered with Ni, therefore oxidation of Na is minimized. Any metal which is stable in the supercritical ammonia can be used for crucible material. Typical metal includes Ni, V, Mo, Ni—Cr superalloy, etc.

EXAMPLE 7

Another method to cover fresh surfaces of alkali metal is to punch through alkali metal cake with hollow metal tubing. This way, the sidewall of the alkali metal is automatically covered with the inner wall of the tubing, thus reduces surface area exposed to the environment. For example, a slab-shaped Na sandwiched with Ni foil can be prepared by attaching Ni foil immediately after cutting top or bottom surface of the slab. Although the sidewall of the slab is not covered, punching through the Na slab with Ni tubing can create Na cake with sidewall attaching to Ni and top and bottom surface covered with Ni foil. In this way, oxygen/moisture content of alkali metal mineralizer can be greatly reduced.

EXAMPLE 8

When the high-pressure vessel becomes large, it is impossible to load mineralizers to the high-pressure vessel in a glove box. Therefore it is necessary to take alternative procedure to avoid exposure of mineralizers to oxygen/moisture. One method is to use an airtight container which cracks under high pressure. Here is one example of the procedure. Mineralizer is loaded into the airtight container in the glove box. If alkali metal is used, it can be melted and solidified in the way explained in Example 6. Then, the high pressure vessel is loaded with the airtight container and all other necessary parts and materials under atmosphere. After sealing the high-pressure vessel, it is pumped down and heated to evacuate residual oxygen/moisture. Ammonia is charged in the high-pressure vessel and the high-pressure vessel is heated to grow crystals. When internal ammonia pressure exceeds cracking pressure of the airtight container, the mineralizer is released into the ammonia. In this way, mineralizers can be added to ammonia without exposing them to oxygen and moisture.

EXAMPLE 9

To further reduce oxygen concentration, it is effective to remove oxygen in the high-pressure vessel after the high-pressure vessel is sealed and before the ammonia is charged. One practical procedure is to pump and backfill reducing gas in the high-pressure vessel. The reducing gas such as ammonia and hydrogen reacts with residual oxygen in the high-pressure vessel and form water vapor. Therefore, it is further effective to heat the high-pressure vessel to enhance the reduction process.

EXAMPLE 10

In this example, a high-pressure vessel having an inner diameter of 1 inch was used to demonstrate the ammonothermal growth steps with Ce addition as an oxygen getter. Unlike the Examples 1, 2, this high-pressure vessel has an open end on one side. All necessary sources and internal components including 5 g of polycrystalline GaN nutrient held in a Ni basket, 0.4 mm-thick single crystalline GaN seeds, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.4 g of Na was used as a mineralizer. After loading the mineralizer into the high-pressure vessel, six baffles together with seeds and nutrient were loaded. Then, 0.4 g of Ce powder was added. After sealing the high-pressure vessel, it was taken out of the glove box. The high-pressure vessel was connected to a gas/vacuum system, which can pump down the vessel as well as supply $NH_3$ to the vessel. The high-pressure vessel was evacuated with a turbo molecular pump to achieve pressure less than $1\times10^{-5}$ mbar. The actual pressure before filling ammonia was $2.6\times10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. First, the furnace for the crystallization region was maintained at 510° C. and the nutrient region was maintained at 550° C. for 24 hours. This reverse temperature setting was discovered to be beneficial for improving crystal quality as shown in Example 15. Then, the temperatures for the crystallization region and the nutrient region were set to 575 and 510° C. for growth. After 4 days, ammonia was released and the high-pressure vessel was opened. The grown crystal showed yellowish color (the middle sample in FIG. 2), which represented improvement of transparency.

When 0.1 g of Ca lump was added instead of Ce, the grown crystal was semi transparent with slight tan color (the bottom sample in FIG. 2), which represented improvement of transparency. Similar result can be expected with adding oxygen getter containing Al, Mn, or Fe.

EXAMPLE 11

In this example, a high-pressure vessel having an inner diameter of 1 inch was used to demonstrate the ammonothermal growth steps with B addition as surfactant. Unlike the Examples 1, 2, this high-pressure vessel has an open end on one side. All necessary sources and internal components including 5 g of polycrystalline GaN nutrient held in a Ni basket, one 0.4 mm-thick single crystalline GaN seed, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.4 g of Na was used as a mineralizer. After loading the mineralizer into the high-pressure vessel, six baffles together with the seed and nutrient were loaded. Then, 0.1 g of BN platelet was added. After sealing the high-pressure vessel, it was taken out of the glove box. The high-pressure vessel was connected to a gas/vacuum system, which can pump down the vessel as well as supply $NH_3$ to the vessel. The high-pressure vessel was evacuated with a turbo molecular pump to achieve pressure less than $1\times10^{-5}$ mbar. The actual pressure before filling ammonia was $1.8\times10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to,a two zone furnace. The high-pressure vessel was heated up. First, the furnace for the crystallization region was maintained at 510° C. and the nutrient region was maintained at 550° C. for 24 hours. This reverse temperature setting was discovered to be beneficial for improving crystal quality as shown in Example 15. Then, the temperatures for the crystallization region and the nutrient region were set to 575 and 510° C. for growth. After 4 days, ammonia was released and the high-pressure vessel was opened. The grown crystal showed less brownish color (the second sample from the bottom in FIG. 2), which showed improvement of transparency. Also, the structural quality was improved compared to one with conventional ammonothermal growth [5]. The full width half maximum (FWHM) of X-ray rocking curve from (002) and (201) planes were 295 and 103 arcsec, respectively. These numbers are about 5 times smaller than crystals reported in reference [5]. Similar result can be expected with adding surfactant containing In, Zn, Sn, or Bi.

EXAMPLE 12

Figure 3:
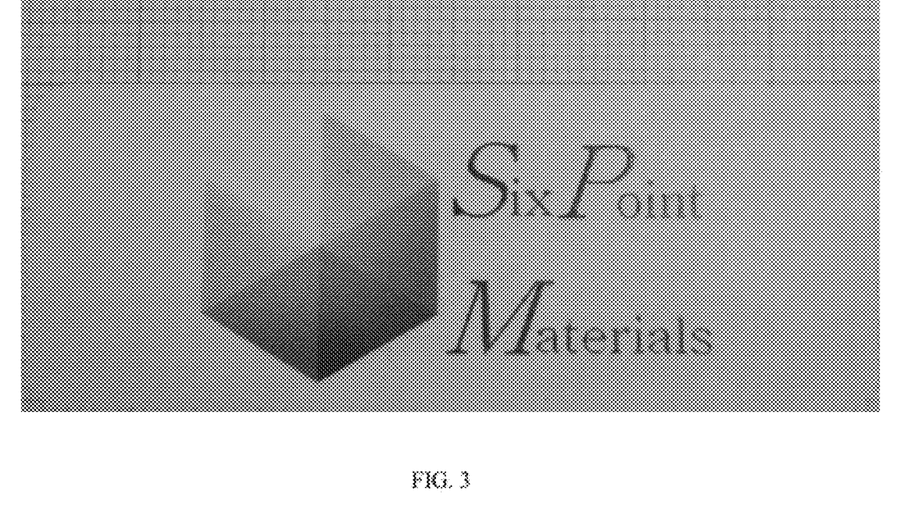
FIG. 3 is a photograph of GaN crystal with Mg additive.

In this example, a high-pressure vessel having an inner diameter of 1 inch was used to demonstrate the ammonothermal growth steps with Mg addition as an oxygen getter. Unlike the Examples 1, 2, this high-pressure vessel has an open end on one side. All necessary sources and internal components including 5 g of polycrystalline GaN nutrient held in a Ni basket, 0.4 mm-thick single crystalline GaN seeds, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.4 g of Na was used as a mineralizer. As explained in Example 6, Na was melted in Ni crucible, capped with Ni foil and solidified. 0.1 g of Mg was added in the Ni crucible on top of the Ni foil. After loading the Ni crucible into the high-pressure vessel, six baffles together with seeds and nutrient were loaded. After sealing the high-pressure vessel, it was taken out of the glove box. The high-pressure vessel was connected to a gas/vacuum system, which can pump down the vessel as well as supply $NH_3$ to the vessel. The high-pressure vessel was evacuated with a turbo molecular pump to achieve pressure less than $1\times10^{-5}$ mbar. The actual pressure before filling ammonia was $1.4\times10^{-7}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. For the first 24 hours, only the furnace for the nutrient region was turned on and maintained at 550° C. while maintaining the furnace for the crystallization region off in order to back etch the surface of the seed. This reverse temperature setting was discovered to be beneficial for improving crystal quality as shown in Example 15. Then, the temperatures for the crystallization region and the nutrient region were set to 590 and 575° C. for growth. After 9 days, ammonia was released and the high-pressure vessel was opened. The grown crystal showed almost transparent as shown in FIG. 3. Thus, reducing oxygen contamination in the process is very effective to improve transparency of the crystal.

EXAMPLE 13

Seed crystals are usually prepared by slicing bulk GaN with wire saw followed by polishing. There is a damage layer at the surface of the seeds created by these slicing and polishing process. To improve structural quality of GaN, it is necessary to remove this damage layer. In addition, impurities physically or chemically adsorbed on the seed surface can be removed with back etching. In this example, a high-pressure vessel having an inner diameter of 1 inch was used to demonstrate the back etching of the seed in the ammonothermal high-pressure vessel. Unlike the Examples 1, 2, this high-pressure vessel has an open end on one side. A GaN seed crystal was back etched by setting the temperature of the crystallization region lower than that of the nutrient region. All necessary sources and internal components including 10 g of polycrystalline GaN nutrient held in a Ni basket, one 0.4 mm-thick single crystalline GaN seed, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 4 g of $NaNH_2$ was used as a mineralizer. After loading the mineralizer into the high-pressure vessel, six baffles together with the seed and nutrient were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was heated at 125° C. and evacuated with a turbo molecular pump to achieve pressure less than $1\times10^{-5}$ mbar. The actual pressure before filling ammonia was $1.8\times10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace. The high-pressure vessel was heated up. The furnace for the crystallization region was maintained off and the nutrient region was maintained at 550° C. The actual temperature measured in the crystallization region was 366° C. It is very important to maintain the temperature difference more than 50° C. to avoid GaN deposition on the seed due to concentration gradient. After 24 hours, ammonia was released and the high-pressure vessel was opened. The seed crystal was back etched by 36 microns, which is sufficient to remove damage layer created by slicing and polishing.

EXAMPLE 13

Although GaN has retrograde solubility at temperatures higher than approximately 400° C., the solubility has normal (i.e. positive) dependence on temperature below approximately 400° C. Therefore it is possible to back etch the seed crystals by setting the crystallization zone lower than 400° C. and maintaining the temperature of crystallization zone higher than that of other zones. It is important to maintain the temperature of the nutrient region at least 50° C. lower than the crystallization region to avoid GaN deposition on the seed due to concentration gradient.

EXAMPLE 14

Seed crystals are usually prepared by slicing bulk GaN with wire saw followed by polishing. There is a damage layer at the surface of the seeds created by these slicing and polishing process. To improve structural quality of GaN, it is necessary to remove this damage layer. In addition, impurities physically or chemically adsorbed on the seed surface can be removed by back etching. In this example, seed crystals were back etched in a separate reactor prior to the ammonothermal growth. Seed crystals with thickness of approximately 0.4 mm were loaded in a furnace reactor which can flow ammonia, hydrogen chloride, hydrogen and nitrogen. In this example, seed crystals were etched in mixture of hydrogen chloride, hydrogen and nitrogen. The flow rate of hydrogen chloride, hydrogen, and nitrogen was 25 sccm, 60 sccm, and 1.44 slm, respectively. The etching rate was 7, 21, 35, and 104 microns/h for 800, 985, 1000, 1050° C. Therefore, back etching above 800° C. gives sufficient removal of the surface layer.

EXAMPLE 15

We discovered that structural quality of grown crystals was improved by utilizing reverse temperature condition during initial temperature ramp. In this example, a high-pressure vessel having an inner diameter of 1 inch was used to demonstrate the effect of reverse temperature setting in the initial stage of growth. Unlike the Examples 1, 2, this high-pressure vessel has an open end on one side. All necessary sources and internal components including 10 g of polycrystalline GaN nutrient held in a Ni basket, 0.4 mm-thick single crystalline GaN seeds, and three flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 4 g of $NaNH_2$ was used as a mineralizer. After loading the mineralizer into the high-pressure vessel, three baffles together with seeds and nutrient were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was heated at 120° C. and evacuated with a turbo molecular pump to achieve pressure less than $1\times10^{-5}$ mbar. The actual pressure before filling ammonia was $1.5\times10^{-6}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 40 g of $NH_3$ was charged in the high-pressure vessel. After closing the high-pressure valve of the high-pressure vessel, it was transferred to a two zone furnace and heated up. The furnace for the crystallization region was maintained at 510° C. and the nutrient region was maintained at 550° C. for 6 hours. Then, the temperatures for the crystallization region and the nutrient region were set to 575 and 510° C. for growth. After 7 days, ammonia was released and the high-pressure vessel was opened. The grown crystals had thickness of approximately 1 mm. The structural quality was improved compared to one with conventional ammonothermal growth [5]. The full width half maximum (FWHM) of X-ray rocking curve from (002) and (201) planes were 169 and 86 aresec, respectively.

EXAMPLE 16

We discovered that setting the crystallization temperature slightly lower than the nutrient temperature during growth significantly reduced parasitic deposition of polycrystalline GaN on the inner surface of reactor. Although the GaN has retrograde solubility in supercritical ammunonobasic solution as disclosed in the Ref. [6, 13-16], we discovered that GaN crystal growth occurred even with reverse temperature condition. Moreover, structural quality of grown crystal was improved without sacrificing growth rate.

A high-pressure vessel having an inner diameter of 1 inch was used to demonstrate the effect of reverse temperature setting during growth. Unlike the Examples 1, 2, this high-pressure vessel has an open end on one side. All necessary sources and internal components including 10 g of polycrystalline GaN nutrient held in a Ni basket, 0.47 mm-thick single crystalline GaN seeds, and six flow-restricting baffles were loaded into a glove box together with the high-pressure vessel. The glove box is filled with nitrogen and the oxygen and moisture concentration is maintained to be less than 1 ppm. Since the mineralizers are reactive with oxygen and moisture, the mineralizers are stored in the glove box at all times. 2.6 g of Na solidified in Ni crucible and capped with Ni foil as explained in Example 6 was used as a mineralizer. After loading the Ni crucible into the high-pressure vessel, six baffles together with seeds and nutrient basket were loaded. After sealing the high-pressure vessel, it was taken out of the glove box. Then, the high-pressure vessel was connected to a gas/vacuum system, which can pump down the vessel as well as supply $NH_3$ to the vessel. The high-pressure vessel was and evacuated with a turbo molecular pump to achieve pressure less than $1\times10^{-5}$ mbar. The actual pressure before filling ammonia was $9.5\times10^{-8}$ mbar. In this way, residual oxygen and moisture on the inner wall of the high-pressure vessel were removed. After this, the high-pressure vessel was chilled with liquid nitrogen and $NH_3$ was condensed in the high-pressure vessel. Approximately 44 g of $NH_3$ was charged in the high-pressure vessel. After closing the high-pressure valve of the high-pressure vessel, it was transferred to a two zone furnace and heated up. For the first 24 hours, the furnace for the crystallization zone and nutrient zone were ramped and maintained at 360° C. and 570° C., respectively. As explained in Example 15, this reverse temperature setting ensures back etching of the seed. Then, the crystallization zone was heated and maintained to 535° C. in about 10 minutes and the nutrient region was cooled from 570° C. down to 540° C. in 24 hours. The slow cooling of the nutrient region is expected to reduce sudden precipitation of GaN in the initial stage of growth. After the temperature of the nutrient region became 540° C., this reverse temperature setting (i.e. 535° C. for crystallization region and 540° C. for nutrient region) was maintained for 3 more days. Then, the ammonia was released, reactor was unsealed and cooled. The grown crystals had thickness of approximately 1.2 mm. The average growth rate was 0.183 min/day. The structural quality was improved compared to one with conventional ammonothermal growth [5]. The full width half maximum (FWHM) of X-ray rocking curve from (002) and (201) planes were 56 and 153 arcsec, respectively. Also, parasitic deposition was about 0.3 g, which was more than 50% reduced compared to the conventional temperature setting.

Advantages and Improvements

The disclosed improvements enable mass production of high-quality GaN wafers via ammonothermal growth. By utilizing the new high-pressure vessel design, one can maximize the high-pressure vessel with size limitation of available Ni—Cr based precipitation hardenable superalloy. Procedures to reduce oxygen contamination in the growth system ensures high-purity GaN wafers. Small amount of additives such as Ce, Ca, Mg, Al, Mn, Fe, B, In, Zn, Sn, Bi helps to improve crystal quality. In-situ or ex-situ back etching of seed crystals is effective way to remove damaged layer and any adsorbed impurities from GaN seeds. In addition, reverse temperature setting even for growth scheme is beneficial for reducing parasitic deposition of polycrystalline GaN on the inner surface of the reactor and improving structural quality. These techniques help to improve quality of group III nitride crystals and wafers.

Possible Modifications

Although the preferred embodiment describes a two-zone heater, the heating zone can be divided into more than two in order to attain favorable temperature profile.

Although the preferred embodiment describes the growth of GaN as an example, other group III-nitride crystals may be used in the present invention. The group III-nitride materials may include at least one of the group III elements B, Al, Ga, and In.

Although the preferred embodiment describes the use of polycrystalline GaN nutrient, other form of source such as metallic Ga, amorphous GaN, gallium amide, gallium imide may be used in the present invention.

In the preferred embodiment specific growth apparatuses are presented. However, other constructions or designs that fulfill the conditions described herein will have the same benefit as these examples.

Although the example in the preferred embodiment explains the process step in which $NH_3$ is released at elevated temperature, $NH_3$ can also be released after the high-pressure vessel is cooled as long as seizing of screws does not occur.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

The following references are incorporated by reference herein:

[1]. S. Porowski, MRS Internet Journal of Nitride Semiconductor, Res. 4S1, (1999) G1.3.

[2] T. Inoue, Y. Seki, O. Oda, S. Kurai, Y. Yamada, and T. Taguchi, Phys. Stat. Sol. (b), 223 (2001) p. 15.

[3] M. Aoki, H. Yamane, M. Shimada, S. Sarayama, and F. J. DiSalvo, J. Cryst. Growth 242 (2002) p. 70.

[4] T. Iwahashi, F. Kawamura, M. Morishita, Y. Kai, M. Yoshimura, Y. Mori, and T. Sasaki, J. Cryst Growth 253 (2003) p. 1.

[5] T. Hashimoto, F. Wu, J. S. Speck, S. Nakamura, Jpn. J. Appl. Phys. 46 (2007) L889.

[6] R. Dwilinski, R. Doradziński, J. Garczyński, L. Sierzputowski, Y. Kanbara, U.S. Pat. No. 6,656,615.

[7] R. Dwilinski, R. Doradziński, J. Garczyński, L. Sierzputowski, Y. Kanbara, U.S. Pat. No. 7,132,730.

[8] R. Dwilinski, R. Doradziński, J. Garczyński, L. Sierzputowski, Y. Kanbara, U.S. Pat. No. 7,160,388.

[9] K. Fujito, T. Hashimoto, S. Nakamura, International Patent Application No. PCT/US2005/024239, WO07008198.

[10] T. Hashimoto, M. Saito, S. Nakamura, International Patent Application No. PCT/US2007/008743, WO07117689. See also US20070234946, U.S. application Ser. No. 11/784,339 filed Apr. 6, 2007.

[11] S. Kawabata, A. Yoshikawa, J P 2007-290921.

[12] M. P. D'Evelyn, K. J. Narang, U.S. Pat. No. 6,398,867 B1.

[13] D. Peters, J. Cryst. Crowth, 104 (1990) 411.

[14] T. Hashimoto, K. Fujito, B. A. Haskell, P. T. Fini, J. S. Speck, and S. Nakamura, J. Cryst. Growth 275 (2005) e525.

[15] M. Callahan, B. G. Wang, K. Rakes, D. Bliss, L. Bouthillette, M. Suscavage, S. Q. Wang, J. Mater. Sci. 41 (2006) 1399.

[16] T. Hashimoto, M. Saito, K. Fujito, F. Wu, J. S. Speck, S. Nakamura, J. Cryst. Growth 305 (2007) 311.

Each of the references above is incorporated by reference in its entirety as if put forth in full herein, and particularly with respect to description of methods of making using ammonothermal methods and using these gallium nitride substrates.

What is claimed is:

1. A method for growing group III nitride crystals in a manner that exposes an alkali-metal mineralizer to minimal oxygen and moisture comprising;

(a) loading group III-nitride seed crystals in a crystallization region of a high-pressure vessel and a group III-containing nutrient source in a nutrient region of the high-pressure vessel, the high-pressure vessel having a body defining a chamber containing said crystallization region and said nutrient region, and said high-pressure vessel having a clamp for sealing an end of the reactor, wherein the clamp is formed of precipitation hardenable Ni—Cr based superalloy having a grain flow in a radial direction in the clamp;

(b) loading a metal-covered alkali metal mineralizer in the high-pressure vessel, wherein the metal-covered alkali metal mineralizer is formed by removing a surface oxide layer from the alkali metal mineralizer to expose a fresh surface of the mineralizer, and covering the fresh surface of the alkali metal mineralizer with a metal layer to form the metal-covered alkali metal mineralizer;

(c) sealing the high-pressure vessel;

(d) evacuating the high-pressure vessel to a pressure less than $1 \times 10^{-5}$ mbar;

(e) filling the high-pressure vessel with ammonia;

(f) ramping the temperature of the crystallization region above 500° C.;

(g) maintaining the temperature condition described in (f) for sufficient time to grow crystals;

(h) releasing ammonia to stop crystal growth; and (i) unsealing the high-pressure vessel.

2. The method of claim 1, wherein the method of forming the metal-covered alkali metal mineralizer recited in step (b) involves melting the alkali metal mineralizer and solidifying the alkali metal mineralizer in a metal container.

3. The method of claim 1 wherein the metal layer contains Ni.

4. The method of claim 1 wherein the alkali metal is Na.

5. The method of claim 1 wherein the step (b) of claim 1 is carried out by using an air tight metal container which is filled with the mineralizer in an oxygen and moisture controlled environment and the metal container releases the mineralizer while the high-pressure vessel is self-pressurized by heating.

6. The method of claim 1 wherein the high-pressure vessel is filled with reducing gas and successively pumped to a pressure less than $1 \times 10^{-5}$ mbar at least once.

7. The method of claim 6 wherein the high-pressure vessel is heated during the step described in claim 6.

8. The method of claim 6 wherein the reducing gas contains ammonia.

9. The method of claim 6 wherein the reducing gas contains hydrogen.

10. The method of claim 1 wherein an additive containing at least one of Ce, Ca, Mg, Al, Mn, and Fe is added in addition to the mineralizer.

11. The method of claim 1 wherein an additive containing at least one of B, In, Zn, Sn, and Bi is added in addition to the mineralizer.

12. The method of claim 1 wherein the group III-nitride seed crystals are back etched before starting crystal growth in the step (f).

13. The method of claim 12 wherein the group III nitride seed crystals are back etched by maintaining the temperature of the nutrient region higher than 400° C. and the temperature in the crystallization region is maintained at least 50° C. lower than the temperature of the nutrient region before starting crystal growth in the step (f) of claim 1.

14. The method of claim 12 wherein the group III nitride seed crystals are back etched by maintaining the temperature of crystallization region lower than 400° C. and the temperature in the crystallization region is maintained at least 50° C. higher than the temperature of the nutrient region before starting crystal growth in the step (f) of claim 1.

15. The method of claim 12 wherein the group III nitride seed crystals are thermally back etched at temperature higher than 800° C. in an atmosphere containing etching gas selected from hydrogen fluoride, fluorine, hydrogen chloride, chlorine, hydrogen bromide, bromine, hydrogen iodide, iodine, ammonia, and hydrogen before the step (a) of claim 1.

16. The method of claim 12 wherein the group III nitride seed crystals are back etched by more than 1 micron.

17. The method of claim 1 wherein the temperature of crystallization region is maintained lower than the temperature of the nutrient region before starting crystal growth in the step (f) of claim 1.

18. The method of claim 17 wherein the duration for the step in the claim 17 is more than 1 hour.

19. The method of claim 1 wherein ammonobasic solution is used and the temperature of the crystallization region is set at or lower than the temperature of the nutrient region during the step (g) of claim 1.

20. The method of claim 19 wherein the temperature difference between the crystallization region and the nutrient region is less than 30° C.

21. A method for growing group III nitride crystals using a cylindrical high-pressure vessel having at least a crystallization region and a nutrient region separated by one or more flow restricting baffles comprising:

(a) loading group III-nitride seed crystals in the crystallization region and group III-containing source in the nutrient region;

(b) loading an alkali metal-containing mineralizer in an encapsulant capable of rupturing to release the mineralizer under growth conditions in the high-pressure vessel in a manner that the mineralizer has minimal exposure to oxygen or moisture;

(c) sealing an end of the high-pressure vessel using a clamp formed of a Ni—Cr precipitation hardenable Ni—Cr based superalloy having a grain flow in a radial direction in the clamp;

(d) evacuating the high-pressure vessel to a pressure less than $1 \times 10^{-5}$ mbar;

(e) filling the high-pressure vessel with ammonia;

(f) back etching the seed crystals by maintaining the temperature of the nutrient region higher than 400° C. and the temperature in the crystallization region is maintained at least 50° C. lower than the temperature of the nutrient region;

(g) ramping the temperature of the crystallization region above 500° C.;

(h) maintaining the temperature condition described in (g) for long enough to grow crystals;

(i) releasing ammonia to stop crystal growth;

(j) unsealing the high-pressure vessel.

22. The method of claim 21 wherein the seed crystals are back etched by more than 1 micron in the step (f).

23. A method for growing group III nitride crystals using a cylindrical high-pressure vessel having at least a crystallization region and a nutrient region separated by one or more flow restricting baffles comprising:

(a) loading group III-nitride seed crystals in the crystallization region and group III-containing source in the nutrient region;

(b) loading an alkali metal-containing mineralizer in an encapsulant capable of rupturing to release the mineralizer under growth conditions in the high-pressure vessel in a manner that the mineralizer has minimal exposure to oxygen or moisture;

(c) sealing the high-pressure vessel at an end of the vessel using a clamp formed of precipitation hardenable Ni—Cr based superalloy having a grain flow in a radial direction in the clamp;

(d) evacuating the high-pressure vessel to a pressure less than $1\ 10 \times 10^{-5}$ mbar;

(e) filling the high-pressure vessel with ammonia;

(f) back etching the seed crystals by maintaining the temperature of crystallization region lower than 400° C. and the temperature in the crystallization region is maintained at least 50° C. higher than the temperature of the nutrient region;

(g) ramping the temperature of the crystallization region above 500° C.;

(h) maintaining the temperature condition described in (g) for long enough to grow crystals;

(i) releasing ammonia to stop crystal growth;

(j) unsealing the high-pressure vessel.

24. The method of claim 23 wherein the seed crystals are back etched by more than 1 micron in the step (f).

* * * * *